(12) United States Patent
Cheng et al.

(10) Patent No.: US 11,183,467 B2
(45) Date of Patent: Nov. 23, 2021

(54) FLEXIBLE CIRCUIT BOARD, METHOD FOR MOUNTING THE SAME, AND DISPLAY DEVICE

(71) Applicants: BOE TECHNOLOGY GROUP CO., LTD., Beijing (CN); Ordos Yuansheng Optoelectronics Co., Ltd., Ordos (CN)

(72) Inventors: Chunghao Cheng, Beijing (CN); Bo Zhang, Beijing (CN); Bin Zhao, Beijing (CN)

(73) Assignees: BOE TECHNOLOGY GROUP CO., LTD., Beijing (CN); ORDOS YUANSHENG OPTOELECTRONICS CO., LTD., Inner Mongolia (CN)

( * ) Notice: Subject to any disclaimer, the term of this patent is extended or adjusted under 35 U.S.C. 154(b) by 19 days.

(21) Appl. No.: 16/029,276

(22) Filed: Jul. 6, 2018

(65) Prior Publication Data

US 2019/0139905 A1  May 9, 2019

(30) Foreign Application Priority Data

Nov. 9, 2017  (CN) .......................... 201711100068.7

(51) Int. Cl.
 *H05K 1/02* (2006.01)
 *H01L 23/00* (2006.01)
 (Continued)

(52) U.S. Cl.
 CPC ........ *H01L 23/562* (2013.01); *H01L 21/4853* (2013.01); *H01L 23/4985* (2013.01); *H01L 23/49838* (2013.01); *H01L 27/1218* (2013.01); *H01L 27/1244* (2013.01); *H01L 27/3244* (2013.01)

(58) Field of Classification Search
 CPC ............................ H05K 1/028; H05K 1/0281
 See application file for complete search history.

(56) References Cited

U.S. PATENT DOCUMENTS 4,716,259 A * 12/1987 Tokura ................... H05K 1/028
 174/254
9,660,365 B2 * 5/2017 Baur ................... H01R 12/7041
 (Continued)

FOREIGN PATENT DOCUMENTS

CN  102026475 A  4/2011
CN  102480840 A  5/2012
 (Continued)

OTHER PUBLICATIONS

First Chinese Office Action dated Mar. 14, 2019, received for corresponding Chinese Application No. 201711100068.7.

*Primary Examiner* — Cuong Q Nguyen
*Assistant Examiner* — Peter M Albrecht
(74) *Attorney, Agent, or Firm* — Kinney & Lange, P.A.

(57) ABSTRACT

A flexible circuit board, a display device and a method for mounting a flexible circuit board are disclosed. The flexible circuit board includes: a bendable portion, the flexible circuit board being bendable at the bendable portion to go into a bent state so as to be connected to a workpiece; and at least one opening in the bendable portion. In response to the bent state, a gap is formed between the bendable portion and the workpiece, and the at least one opening is in communication with the gap.

7 Claims, 3 Drawing Sheets

(51) Int. Cl.
*H01L 23/498* (2006.01)
*H01L 27/12* (2006.01)
*H01L 21/48* (2006.01)
*H01L 27/32* (2006.01)

(56) References Cited

U.S. PATENT DOCUMENTS

| | | | | |
|---|---|---|---|---|
| 2006/0109394 | A1* | 5/2006 | Miyagawa | G02F 1/13452 |
| | | | | 349/58 |
| 2011/0067905 | A1 | 3/2011 | Su et al. | |
| 2011/0187965 | A1* | 8/2011 | Ooishi | G09F 13/04 |
| | | | | 349/62 |
| 2014/0078692 | A1* | 3/2014 | Park | H05K 7/02 |
| | | | | 361/749 |
| 2018/0220533 | A1* | 8/2018 | Rissing | H01R 4/34 |

FOREIGN PATENT DOCUMENTS

| | | |
|---|---|---|
| CN | 205196068 U | 4/2016 |
| CN | 205229608 U | 5/2016 |
| JP | 06152077 A | 5/1994 |

* cited by examiner

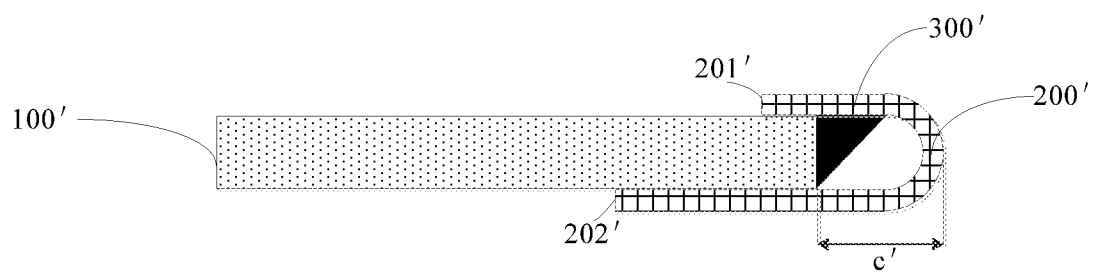

FIG. 1

```
┌─────────────────────────────────────────────────────────────────────┐
│ Fixedly connecting first end 201' of flexible circuit board 200' with first surface of │
│                              workpiece 100'                          │
└─────────────────────────────────────────────────────────────────────┘
                                    │
                                    ▼
┌─────────────────────────────────────────────────────────────────────┐
│ Applying adhesive 300' at an edge of workpiece 100' near position where first end 201' of │
│  flexible circuit board 200' is fixedly connected with first surface of workpiece 100'   │
└─────────────────────────────────────────────────────────────────────┘
                                    │
                                    ▼
┌─────────────────────────────────────────────────────────────────────┐
│  Bending flexible circuit board 200' and fixedly connecting second end 202' of flexible  │
│          circuit board 200' with second surface of workpiece 100'                        │
└─────────────────────────────────────────────────────────────────────┘
```

FIG. 2

FLEXIBLE CIRCUIT BOARD, METHOD FOR MOUNTING THE SAME, AND DISPLAY DEVICE

CROSS-REFERENCE TO RELATED APPLICATION

This application claims the priority benefit of Chinese Patent Application No. 201711100068.7 filed on Nov. 9, 2017 in the State Intellectual Property Office of China, the disclosure of which is incorporated herein by reference in entirety.

BACKGROUND

The present disclosure relates to the field of display technologies, and in particular, to a flexible circuit board, a method for mounting the flexible circuit board, and a display device.

At present, when a display panel is assembled, it is usually necessary to bend and fix a flexible circuit board to a back of the display panel, so that wires on the flexible circuit board are easily broken. To prevent the wires from being broken after the flexible circuit board is bent, it is possible to apply an adhesive into a space between the flexible circuit board and an edge of an array substrate of the display panel when the flexible circuit board is mounted. However, due to limitations on the adhesive applying process, the adhesive may have a certain width. As a result, a protruding amount of the flexible circuit board after it is bent is increased, thereby increasing an outer dimension of the display panel.

SUMMARY

In an aspect, it is provided a flexible circuit board including: a bendable portion, the flexible circuit board being bendable at the bendable portion to go into a bent state so as to be connected to a workpiece; and at least one opening in the bendable portion. In response to the bent state, a gap is formed between the bendable portion and the workpiece, and the at least one opening is in communication with the gap.

Optionally, the at least one opening includes at least one notch at an edge of the bendable portion.

Optionally, the at least one opening includes at least one through hole in the bendable portion.

Optionally, the at least one opening includes at least one through hole in the bendable portion.

Optionally, the at least one notch has a size within a range of millimeter scale to micrometer scale.

Optionally, the at least one through hole has a circular shape, an elliptical shape or a polygonal shape.

Optionally, the at least one through hole has a size within a range of millimeter scale to micrometer scale.

Optionally, the flexible circuit board carries a chip.

In another aspect, it is provided a display device including: a substrate; and a flexible circuit board connected to the substrate, the flexible circuit board including: a bendable portion, the flexible circuit board being bendable at the bendable portion; and at least one opening in the bendable portion. A gap is formed between the bendable portion and the substrate, and the at least one opening is in communication with the gap.

Optionally, the gap is formed between the bendable portion and a side surface of the substrate near the bendable portion.

Optionally, a maximum distance between an outer surface of the bendable portion and the side surface of the substrate near the bendable portion is less than or equal to 2.5 mm.

Optionally, the gap is filled with an adhesive.

Optionally, the at least one opening includes at least one notch at an edge of the bendable portion.

Optionally, the at least one opening includes at least one through hole in the bendable portion.

Optionally, the at least one opening includes at least one through hole in the bendable portion.

Optionally, the flexible circuit board has a first end and a second end opposite to each other, and the bendable portion is disposed between the first end and the second end; and the substrate has a first surface and a second surface opposite to each other, the first end of the flexible circuit board is fixedly connected to the first surface of the substrate, and the second end of the flexible circuit board is fixedly connected to the second surface of the substrate.

Optionally, the substrate is an array substrate or a color filter substrate.

In a further aspect, it is provided a method for mounting a flexible circuit board to a workpiece, wherein the flexible circuit board includes a first end and a second end opposite to each other, and a bendable portion between the first end and the second end, the bendable portion being provided with at least one opening, and wherein the workpiece including a first surface and a second surface opposite to each other, the method including: performing a first fixed connection between the first end of the flexible circuit board and the first surface of the workpiece; bending the flexible circuit board at the bendable portion in such a way that a gap is formed between the bendable portion and the workpiece; performing a second fixed connection between the second end of the flexible circuit board and the second surface of the workpiece; and injecting an adhesive into the gap through the at least one opening.

Optionally, bending the flexible circuit board at the bendable portion in such a way that a gap is formed between the bendable portion and the workpiece includes: bending the flexible circuit board at the bendable portion in such a way that the gap is formed between the bendable portion and the workpiece and a maximum distance between an outer surface of the bendable portion and a side surface of the workpiece near the bendable portion is less than or equal to 2.5 mm.

Optionally, each of the first fixed connection and the second fixed connection includes binding, bonding or welding.

The present summary is provided only by way of example, and not limitation.

Other aspects of the present disclosure will be appreciated in view of the entirety of the present disclosure, including the entire text, claims, and accompanying figures.

BRIEF DESCRIPTION OF THE DRAWINGS

FIG. 1 is a schematic structural view of a display device having a flexible circuit board in the related art;

FIG. 2 is a process flow diagram of a method for mounting a flexible circuit board in the related art;

Figure 3:
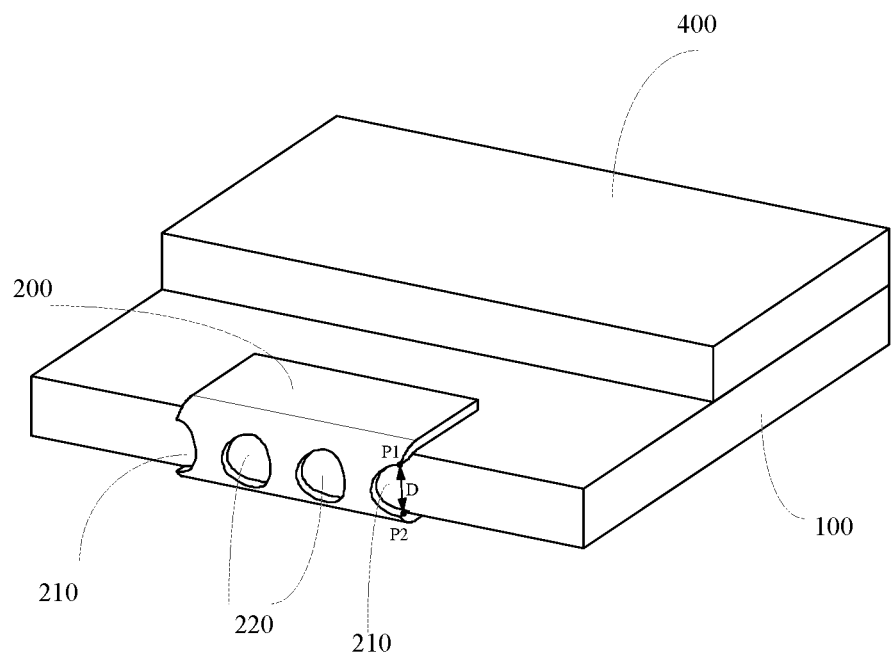
FIG. 3 is a schematic perspective view of a display device according to some embodiments of the present disclosure.

While the above-identified figures set forth one or more embodiments of the present disclosure, other embodiments are also contemplated, as noted in the discussion. In all cases, this disclosure presents the invention by way of representation and not limitation. It should be understood that numerous other modifications and embodiments can be devised by those skilled in the art, which fall within the scope and spirit of the principles of the invention. The figures may not be drawn to scale, and applications and embodiments of the present invention may include features and components not specifically shown in the drawings.

DETAILED DESCRIPTION OF EMBODIMENTS

Embodiments of the present disclosure will be described in detail below. The embodiments described below are only illustrative for explaining the present disclosure and are not to be construed as limiting the disclosure. Where specific techniques or conditions are not indicated in the embodiments, they are carried out according to the techniques or conditions described in the related art or product specifications. Any reagents or instruments that are not indicated by the manufacturer are commercially available.

In a current method for mounting a flexible circuit board, referring to FIGS. 1 and 2, firstly, a first end 201' of a flexible circuit board 200' is fixedly connected with a first surface (for example, an upper surface shown in FIG. 1) of a workpiece 100'; secondly, an adhesive 300' is applied at an edge of the workpiece 100' near the position where the first end 201' of the flexible circuit board 200' is fixedly connected with the first surface of the workpiece 100'; finally, the flexible circuit board 200' is bent and a second end 202' of the flexible circuit board 200' is fixedly connected with a second surface (for example, a lower surface shown in FIG. 1) of the workpiece 100'. However, due to limitations on the current adhesive applying process, the applied adhesive has a certain width. As a result, a protruding amount c' of the flexible circuit board after it is bent is increased, thereby causing an increase in product size. In view of the above problem, the inventors conducted in-depth researches. After researches, it is found that it is possible to modify a structure of the flexible circuit board and the adhesive applying process, in particular, to perform the adhesive applying process after the flexible circuit board is bent, thereby effectively reducing the width of the adhesive. In this way, the protruding amount of the flexible circuit board after it is bent may be reduced and the product size is reduced, thereby effectively increasing the competitiveness of the product.

Figure 4:
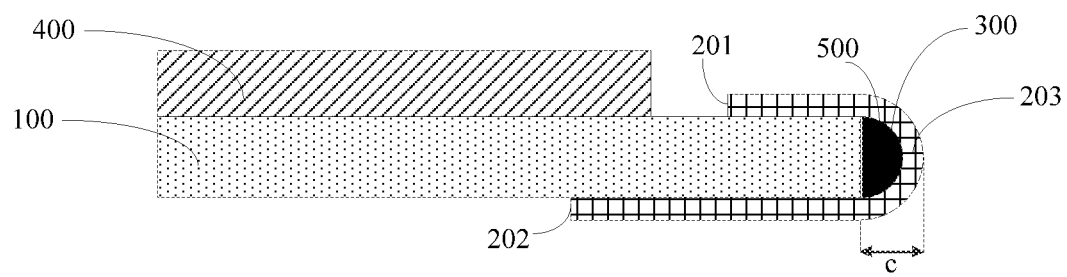
FIG. 4 is a cross-sectional view of a display device according to some embodiments of the present disclosure.

In an aspect of the present disclosure, a flexible circuit board is provided. As shown in FIGS. 3 and 4, a flexible circuit board 200 may include: a bendable portion 203, the flexible circuit board 200 being bendable at the bendable portion 203 to go into a bent state so as to be connected with a workpiece 100; and at least one opening in the bendable portion 203. As shown, in the bent state of the flexible circuit board 200, a gap 500 is formed between the bendable portion 203 and the workpiece 100, and the at least one opening is in communication with the gap 500.

For example, the at least one opening may include at least one notch 210 disposed at an edge of the bendable portion 203. Alternatively or additionally, the at least one opening may include at least one through hole 220 disposed in the bendable portion 203.

The at least one notch 210 and/or the at least one through hole 220 is in communication with the gap 500, so that an adhesive 300 (shown in FIG. 4) may be injected into the gap 500 through the at least one notch 210 and/or the at least one through hole 220.

As shown in FIG. 4, the flexible circuit board 200 may also include a first end 201 and a second end 202 opposite to each other. The bendable portion 203 is disposed between the first end 201 and the second end 202.

According to an embodiment of the present disclosure, types of the workpiece are not particularly limited. In some embodiments of the present disclosure, the workpiece may be an array substrate, a rigid circuit board, or other workpiece that requires a flexible circuit board as a bridging device. In some embodiments of the present disclosure, the workpiece may be a substrate such as an array substrate.

For example, as shown in FIGS. 3 and 4, the workpiece 100 may have an upper surface and a lower surface opposite to each other.

Figure 5:
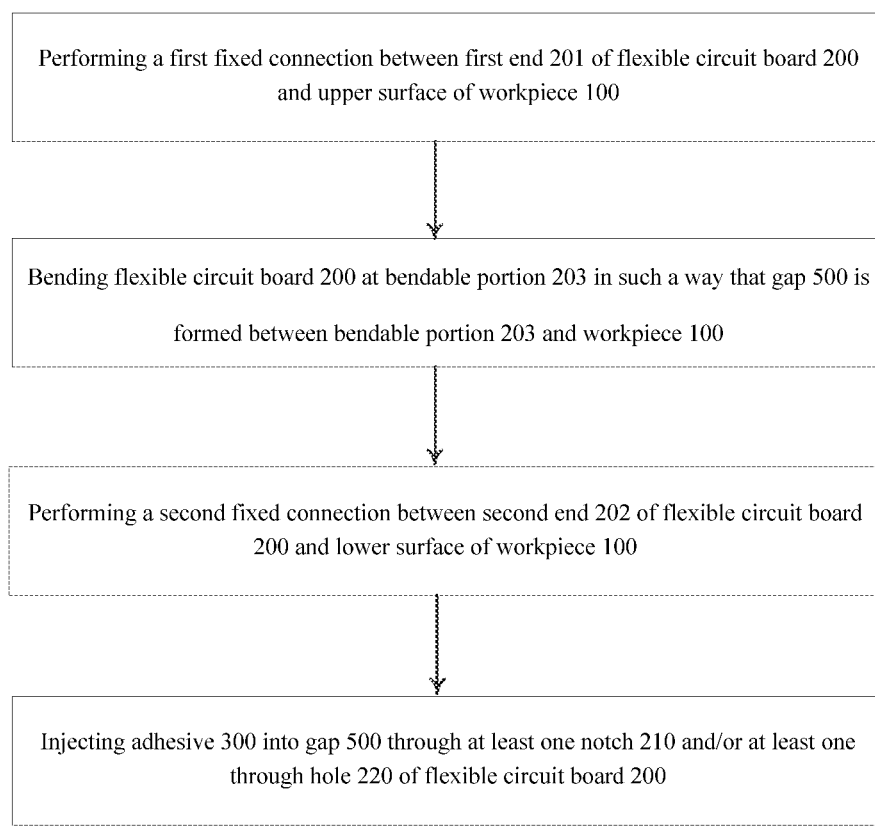
FIG. 5 is a process flow diagram of a method for mounting a flexible circuit board according to some embodiments of the present disclosure.

In another aspect of the present disclosure, a method for mounting the flexible circuit board 200 onto the workpiece 100 is also provided. As shown in FIGS. 3-5, the method may include: performing a first fixed connection (i.e. firstly fixedly connecting) between the first end 201 of the flexible circuit board 200 and the upper surface of the workpiece 100; bending the flexible circuit board 200 at the bendable portion 203 in such a way that the gap 500 is formed between the bendable portion 203 and the workpiece 100; performing a second fixed connection (i.e. secondly fixedly connecting) between the second end 202 of the flexible circuit board 200 and the lower surface of the workpiece 100; and injecting the adhesive 300 into the gap 500 through the at least one notch 210 and/or the at least one through hole 220 of the flexible circuit board 200.

The inventors have found that the protruding amount c of the flexible circuit board after it is bent may be effectively reduced by using the above-mentioned flexible circuit board and the method for mounting the flexible circuit board. For example, in some embodiments of the present disclosure, referring to FIG. 4, a maximum distance c (also referred to as protruding amount c) between an outer surface of the bendable portion 203 and a side surface of the workpiece 100 near the bendable portion 203 may be less than or equal to 2.5 mm. As a result, the protruding amount of the flexible circuit board may be relatively small, and thus a frame size of a product having the flexible circuit board may be designed to be smaller, thereby obtaining a relatively narrow bezel, a relatively small product size, and increasing the competitiveness of the product.

In an aspect of the present disclosure, a display device is provided. As shown in FIGS. 3 and 4, a display device may include: a substrate 100; and a flexible circuit board 200 connected with the substrate 100. As stated above, the flexible circuit board 200 may include: a bendable portion 203, the flexible circuit board 200 being bendable at the bendable portion 203; and at least one opening in the bendable portion 203. A gap 500 is formed between the bendable portion 203 and the substrate 100, and the at least one one opening is in communication with the gap 500. For example, the gap 500 may be formed between the bendable region 203 and a side surface of the substrate 100 near the bendable portion. For example, an adhesive 300 may be applied into the gap 500.

In the illustrated embodiment, the first end 201 of the flexible circuit board 200 is fixedly connected with the upper surface of the substrate 100, and the second end 202 of the flexible circuit board 200 is fixedly connected with the lower surface of the substrate 100.

Similarly, in the display device, a maximum distance between an outer surface of the bendable portion 203 and a side surface of the substrate 100 near the bendable portion 203 may be less than or equal to 2.5 mm. Therefore, the peripheral area and the overall size of the display device may be made small, which is advantageous for realizing a narrow bezel and a small-sized display device, thereby improving the competitiveness of the display device.

According to an embodiment of the present disclosure, the specific structure of the flexible circuit board is not particularly limited, and those skilled in the art may flexibly select the specific structure of the flexible circuit board according to actual needs. In some embodiments of the present disclosure, a certain circuit structure may be disposed on the flexible circuit board, or the flexible circuit board may carry a chip, for example, to form a chip on film (COF) or the like.

According to an embodiment of the present disclosure, a position of the bendable portion on the flexible circuit board is not particularly limited as long as requirements may be met, and it may be flexibly selected by those skilled in the art according to actual needs. For example, in some embodiments of the present disclosure, the bendable portion 203 may be disposed at a position, which is closer to the first end 201, on the flexible circuit board 200.

According to an embodiment of the present disclosure, the shape of the notch 210 is not particularly limited, for example, the notch may include but not limited to a notch, of which an outer circumference is in a polyline shape or a curved line shape. The size of the notch 210 is also not particularly limited as long as it does not damage the flexible circuit board and facilitates the injection of adhesive. Those skilled in the art may flexibly select the size of the notch according to actual needs, for example, the size of the notch may be within a range of millimeter scale to micrometer scale. It should be understood that "the size of the notch" herein may include a maximum value of linear distances between any two points on a contour line of the notch, for example, as shown in FIG. 3, a maximum value of linear distances between any two points on a contour line of the notch 210 may be a linear distance D between a point P1 and a point P2. In this way, the notch may be provided in the bendable portion without damaging the flexible circuit board and without affecting adversely a circuit distribution on the flexible circuit board. Further, a problem that wires on the flexible circuit board are broken may be effectively avoided by injecting the adhesive into the gap through the notch.

According to an embodiment of the present disclosure, the shape of the through hole 220 is not particularly limited, for example, may include but be not limited to, a regular shape (such as a circular shape, an elliptical shape, a square shape, or a long strip shape) or an irregular shape. In some embodiments of the present disclosure, the shape of the through hole 220 may be a circular shape, an elliptical shape, or a polygonal shape. In this way, the structure is simple and easy to implement, and the adhesive injection process may be smoothly carried out.

According to an embodiment of the present disclosure, the size of the through hole 220 is not particularly limited as long as requirements may be met. Those skilled in the art may flexibly select the size of the through hole according to actual needs. In some embodiments of the present disclosure, the size of the through hole may be within a range of millimeter scale to micrometer scale. It should be understood that "the size of the through hole" herein may include a diameter of the through hole. In some embodiments of the present disclosure, the through hole may have a size of 0.1 to 1 mm. The size of the through holes is within a range of millimeter scale to micrometer scale so that the flexible circuit board is not damaged while the adhesive injection process is facilitated.

According to an embodiment of the present disclosure, the arrangement of the through holes 220 is not particularly limited, and as long as the requirements may be met and the circuit distribution on the flexible circuit board is not adversely affected. Those skilled in the art may flexibly select the arrangement of the through holes according to actual needs. For example, the arrangement of the through holes may include but be not limited to a regular arrangement or an irregular arrangement. According to an embodiment of the present disclosure, the number of the through holes 220 is also not particularly limited. When the number of the through holes is one, the through hole may be disposed at any position on the bendable portion. When the number of the through holes is plural, a distance between two adjacent through holes is not particularly limited. These arrangements may be flexibly selected by those skilled in the art as needed as long as the requirements may be met.

According to an embodiment of the present disclosure, types of the workpiece are not particularly limited. In some embodiments of the present disclosure, the workpiece may be an array substrate, a rigid circuit board, or other workpiece that requires a flexible circuit board as a bridging device. In some embodiments of the present disclosure, the workpiece is an array substrate. Thereby, the peripheral area and the overall size of the display device including the array substrate may be made small, which is advantageous for improving the competitiveness of the display device.

According to an embodiment of the present disclosure, types of the array substrate are not particularly limited, for example, may include but be not limited to, a thin film transistor array substrate, a color filter substrate, and the like.

According to an embodiment of the present disclosure, in addition to the flexible circuit board described above, the display device further includes components that a typical display device should include, such as a color film substrate, a glass cover plate, an encapsulation layer or the like. In the embodiment illustrated in FIGS. 3 and 4, the display device further includes a glass cover plate 400.

According to an embodiment of the present disclosure, types of the display device are not particularly limited, and they may be flexibly selected by those skilled in the art according to actual needs as long as the requirements are met. For example, the display device may be a display panel or a device that is combined by the display panel and other structural components, for example, may include but not be limited to a computer, a mobile phone, a tablet, a car display, a wearable device or the like.

According to an embodiment of the present disclosure, types of the adhesive are not particularly limited as long as wires on the flexible circuit board may be effectively prevented from being broken after the flexible circuit board is bent, and they may be flexibly selected by those skilled in the art according to actual needs. For example, the adhesive may include but be not limited to, a back adhesive, polyethylene terephthalate, a resin, a polyimide or the like. Therefore, the material source for the adhesive is wide and the price thereof is low. Further, the above adhesive may be applied into the above-mentioned gap to effectively prevent the wires on the flexible circuit board from being broken after the flexible circuit board is bent.

According to an embodiment of the present disclosure, manners of the first fixed connection (i.e. firstly fixedly connecting) and the second fixed connection (i.e. secondly fixedly connecting) are not particularly limited as long as the flexible circuit board and the workpiece are effectively connected, and they may be flexibly selected by those skilled in the art according to actual needs. In some embodiments of the present disclosure, each of the first fixed connection and the second fixed connection may include binding, bonding or welding. For example, the first fixed connection and the second fixed connection may be the same or different.

In yet another aspect of the present disclosure, a method for manufacturing a display panel is provided. According to an embodiment of the present disclosure, the flexible circuit board in the display panel is mounted by the method described above.

Those skilled in the art can understand that, in addition to the steps of mounting the flexible circuit board as described above, steps and operations necessary for conventionally manufacturing the display panel, such as steps for manufacturing the TFT array substrate, steps for manufacturing the color filter substrate, and steps for packaging the TFT array substrate and the color filter substrate, or the like, may also be included, and they are not repeated here.

In yet another aspect of the present disclosure, the present disclosure provides a display panel. According to an embodiment of the present disclosure, the display panel may include the flexible circuit board described above or may be manufactured by the method described above.

According to an embodiment of the present disclosure, types of the display panel are not particularly limited, and may include but be not limited to, an LCD panel or an OLED display panel, etc. The specific structure of the display panel is also not particularly limited. In addition to the flexible circuit board and the array substrate described above, the display panel may further include structures and components of a typical display panel, which are not repeated here.

In the description of the present disclosure, it is to be understood that orientations or positional relationships indicated by the terms "center", "longitudinal", "transverse", "length", "width", "thickness", "upper", "lower", "front", "rear", "left", "right", "vertical", "horizontal", "top", "bottom", "inside", "outside", "clockwise", "counterclockwise", "axial", "radial", "circumferential" and the like are based on the orientations or positional relationships shown in the drawings, and are merely for convenience of describing the present disclosure and the simplified description, and do not indicate or imply the indicated device or component must be constructed and operated in the particular orientations. Therefore, they are not to be construed as limiting the present disclosure.

Moreover, the terms "first" and "second" are used for descriptive purposes only and are not to be construed as indicating or implying a relative importance or the number of technical features indicated by the terms. Thus, features defined by "first" and "second" may include one or more of the features either explicitly or implicitly. In the description of the present disclosure, the term "a plurality" is meant to two or more, unless specifically defined otherwise.

In the present disclosure, unless explicitly stated or defined otherwise, the terms "mounting", "connecting", "connected", "fixed" and the like, are to be understood broadly, for example, may be either a fixed connection or a detachable connection, or integrated; may be either a mechanical connection or an electrical connection; may be directly connected, or indirectly connected through an intermediate medium; may be an internal communication of two elements or an interaction of two elements. For those skilled in the art, the specific meanings of the above terms in the present disclosure may be understood according to specific cases.

In the present disclosure, unless otherwise explicitly stated and defined, the expression that a first feature is "on" or "under" a second feature may include a case that the first feature is in a direct contact with a second feature, or a case that the first feature is in an indirect contact with the second feature through an intermediate medium. Moreover, the expression that the first feature is "above" the second feature may include that the first feature is directly above or angularly above the second feature, or merely that a level of the first feature is higher than that of the second feature. The expression that the first feature is "below" the second feature may include that the first feature is directly below or angularly below the second feature, or merely that a level of the first feature is lower than that of the second feature.

In the description of the present specification, the description with reference to the terms "one embodiment", "some embodiments", "example", "specific example", or "some examples" and the like means a specific feature, structure, material, or characteristic described in connection with the embodiment or example is included in at least one embodiment or example of the present disclosure. In the present specification, the schematic representations of the above terms are not necessarily directed to the same embodiment or example. Furthermore, the specific features, structures, materials, or characteristics may be combined in a suitable manner in any one or more embodiments or examples. In addition, various embodiments or examples described in the specification, as well as features of various embodiments or examples, may be combined and combined.

While the embodiments of the present disclosure have been shown and described above, it is understood that the above-described embodiments are illustrative and are not to be construed as limiting the scope of the disclosure. Variations, modifications, alterations and changes of the above-described embodiments may be made by those skilled in the art within the scope of the present disclosure.

The invention claimed is:

1. A display device, comprising:
a substrate, the substrate comprising a first surface and a second surface opposite to each other; and
a flexible circuit board connected to the substrate, the flexible circuit board comprising:
a first end and a second end opposite to each other;
a bendable portion between the first end and the second end, the flexible circuit board being bendable at the bendable portion; and
at least one opening in the bendable portion,
wherein the first end is fixedly connected to the first surface, and the second end is fixedly connected to the second surface,
wherein a gap is formed between the bendable portion and a side surface of the substrate near the bendable portion, the side surface extends between the first surface and the second surface of the substrate, the at least one opening is opposite to the side surface of the substrate near the bendable portion, the at least one opening is in communication with the gap, the at least one opening comprises at least one through hole in the bendable portion, and a diameter of the at least one through hole ranges from 0.1 to 1 mm, wherein a maximum distance between an outer surface of the bendable portion and the side surface of the substrate near the bendable portion is less than or equal to 2.5 mm, and wherein the gap is filled with an adhesive, and the adhesive is in direct contact with the bendable portion and the side surface of the substrate near the bendable portion.

2. The display device according to claim 1, wherein the at least one through hole has a circular shape, an elliptical shape or a polygonal shape.

3. The display device according to claim 1, wherein the at least one opening comprises at least one notch at an edge of the bendable portion.

4. The display device according to claim 3, wherein the at least one notch has a size within a range of millimeter scale to micrometer scale.

5. The display device according to claim 1, wherein the substrate is an array substrate or a color filter substrate.

6. A method for mounting a flexible circuit board to a workpiece, wherein the flexible circuit board comprises a first end and a second end opposite to each other, and a bendable portion between the first end and the second end, the bendable portion being provided with at least one opening, and wherein the workpiece comprises a first surface and a second surface opposite to each other, the method comprising:

performing a first fixed connection between the first end of the flexible circuit board and the first surface of the workpiece;

bending the flexible circuit board at the bendable portion in such a way that a gap is formed between the bendable portion and the workpiece;

performing a second fixed connection between the second end of the flexible circuit board and the second surface of the workpiece; and injecting an adhesive into the gap through the at least one opening so that the gap is filled with the adhesive, wherein bending the flexible circuit board at the bendable portion in such a way that the gap is formed between the bendable portion and the workpiece comprises:

bending the flexible circuit board at the bendable portion in such a way that the gap is formed between the bendable portion and a side surface of the workpiece near the bendable portion, the side surface extending between the first surface and the second surface of the workpiece, and a maximum distance between an outer surface of the bendable portion and the side surface of the workpiece near the bendable portion is less than or equal to 2.5 mm, wherein the at least one opening is opposite to the side surface of the workpiece near the bendable portion, the at least one opening comprises at least one through hole in the bendable portion, and a diameter of the at least one through hole ranges from 0.1 to 1 mm, and wherein the adhesive is in direct contact with the bendable portion and the side surface of the workpiece near the bendable portion.

7. The method according to claim 6, wherein each of the first fixed connection and the second fixed connection comprises binding, bonding or welding.

* * * * *